(12) United States Patent
Fukatsu et al.

(10) Patent No.: US 6,286,491 B1
(45) Date of Patent: Sep. 11, 2001

(54) IGNITION APPARATUS AND AN IGNITION CONTROL SYSTEM OF AN INTERNAL COMBUSTION ENGINE AND IGBT OF AN INTERNAL COMBUSTION ENGINE

(75) Inventors: Katsuaki Fukatsu, Urizura-machi; Ryoichi Kobayashi, Tokai-mura; Takashi Ito, Naka-machi, all of (JP)

(73) Assignees: Hitachi, Ltd., Tokyo; Hitachi Car Engineering Co., Ltd., Hitachinaka, both of (JP)

( * ) Notice: Subject to any disclaimer, the term of this patent is extended or adjusted under 35 U.S.C. 154(b) by 0 days.

(21) Appl. No.: 09/431,161

(22) Filed: Nov. 1, 1999

(30) Foreign Application Priority Data

Oct. 30, 1998 (JP) .................................................. 10-309836

(51) Int. Cl.$^7$ ...................................................... F02P 1/00
(52) U.S. Cl. ............................................. 123/644; 123/651
(58) Field of Search ..................................... 123/644, 651

(56) References Cited

U.S. PATENT DOCUMENTS

| | | | |
|---|---|---|---|
| 5,299,543 | * | 4/1994 | Taruya et al. ..................... 123/644 |
| 5,970,964 | * | 10/1999 | Furuhata et al. .................. 123/644 |

FOREIGN PATENT DOCUMENTS 2-171904    7/1990   (JP) .

* cited by examiner

*Primary Examiner*—John Kwon
(74) *Attorney, Agent, or Firm*—Crowell & Moring LLP

(57) ABSTRACT

A mesh structure portion is provided at a part of a stripe structure IGBT chip, gate resistance of a respective minute IGBT is reduced and in a gate portion chip a filter is constituted by a resistor and a condenser. Under a severe environment such as an integrated ignition coil, a small size and a low cost ignitor which can use without a necessity for a protection circuit by a peripheral circuit can be provided. An ignition apparatus having IGBT which is strong against serge resistant performance and noise resistant performance can be obtained.

7 Claims, 5 Drawing Sheets

IGNITION APPARATUS AND AN IGNITION CONTROL SYSTEM OF AN INTERNAL COMBUSTION ENGINE AND IGBT OF AN INTERNAL COMBUSTION ENGINE

BACKGROUND OF THE INVENTION

The present invention relates to an ignition apparatus and an ignition control system of an internal combustion engine and IGBT (an insulation gate type bipolar transistor) of an internal combustion engine and in particularly to relates to an ignition apparatus and an ignition control system of an internal combustion engine and IGBT of an internal combustion engine in which an anti-noise performance and an anti-serge performance are improved.

A technique in which IGBT (an insulation gate type bipolar transistor) is used in an ignition apparatus of an internal combustion engine and to this IGBT a protection function is provided is disclosed in Japanese application patent laid-open publication No. Hei 2-171904 and this technique relates to a technique in which IGBT is protected from a circuit of an outside of IGBT chip and many techniques similar to the above stated technique have published.

In the present invention, an ignition apparatus of an internal combustion engine is used under a severe and special environment such as a high voltage serge and noises and IGBT chip main body having a function for guarding this IGBT is constituted in a chip.

In particularly, the present invention is devised to correspond the special noises and serge as an ignitor being the ignition apparatus of the internal combustion engine. This technique is not shown in the conventional technique.

The main current of the ignitor in the recent year is one which is provided in an ignition coil as one body according to the requirements of an intensive performance of the functions and a small size and a light weight performance in an ignition system.

Further, as the performances, a large current performance in IGBT is requested according to the requirements of a high output performance, a high energy performance, a small size performance in the ignition coil. On the other hand a small consumption electric power performance including an ignitor drive circuit in ECU (an engine control unit) is requested and to correspond to this a switching element is now transferring from a bipolar power transistor to IGBT (the insulation gate type bipolar transistor).

Since the ignitor is installed in an interior portion as the ignition coil wherein the high voltage is generated and since the ignitor is necessary to endure in the environment which is exposed the unprecedented level noises and the precedent frequency level noises and the serge, there is a problem an improvement of an opposing forces to the above stated noises and the above stated serges of IGBT itself including a peripheral circuit.

SUMMARY OF THE INVENTION

An object of the present invention is to provide an ignition apparatus and an ignition control system of an internal combustion engine and IGBT (an insulation gate type bipolar transistor) of an internal combustion engine in which IGBT withstands strongly to the serges and noises and an ignition apparatus and an ignition control system of an internal combustion engine using this IGBT.

The above stated object of the present invention is attained by in an ignition apparatus of an internal combustion engine comprising a circuit for controlling a primary current of an ignition coil of the internal combustion engine according to a signal from an outside, a part of said circuit is formed according to an insulation gate type bipolar transistor (IGBT), and an interior gate electrode of said IGBT is constituted by a cell having two different shapes.

Further, the above stated object of the present invention is attained by an ignition control system comprising an ignition apparatus having a circuit for controlling a primary current of an ignition coil of an internal combustion engine in response to a signal from an outside and a part of said circuit is formed by IGBT (an insulation gate type bipolar transistor) and further a gate electrode of said IGBT has a cell having two different shapes, and a control of a fuel amount for supplying to the internal combustion engine and a control apparatus for controlling an ignition of the internal combustion engine.

Further, the above stated object of the present invention is attained by an insulation gate type bipolar transistor (IGBT) in which an internal portion gate electrode is constituted by a cell having two different shapes.

Further, the above stated object of the present invention is attained by an insulation gate type bipolar transistor (IGBT) comprising a condenser (C1) which is provided between said gate electrode and an emitter electrode, and a resistor (R2) connected to said gate voltage, and said resistor is provided to a side of said gate electrode from said condenser and is provided to a side of said gate electrode form said Zener diode condenser (ZD2).

According to the above stated solving means according to the present invention, (1) when the serge enters into the serge, according to an influence of the resistance which is parasitic on between the gate of the respective cells of IGBT which is constituted by plural cells (the minute IGBT), the scattering is caused in the balance of an operation start timing of the respective sells due to the transmission delay of the signal, the solving means is no occurrence of the cell destroy.

To this, in the stripe structure which is the wiring method of the chip used for the originally anxious latch-up countermeasure in IGBT, to reduce the parasitic resistance of the above stated gate, the wiring is formed to the mesh structure and by attaining the reduction of the parasitic resistance which is the feature of the mesh structure the whole chip is formed with the stripe structure, and IGBT is made strong against the latch-up.

Such a latch-up indicates the condition where when the runaway of IGBT according to the temperature rise of the element and when the collector current (Ic) is increased, etc., since the main current is not flown into through pnp transistor and npn transistor, this main current is not flown into MOSFET which constitutes a part of IGBT, the control of the collector current (Ic) according to G (gate) becomes incompetence.

(2) The filter for reducing the noises and the serge itself being superposed by the outside is constituted in the interior portion of IGBT. The condenser is formed between the gate and the emitter and the high pass filter against the high frequency serge is constituted, and further by putting the resistance together the parasitic condenser, and then the low pass filter is constituted.

As a result, the noise resistant performance and the serge resistant performance in IGBT of an ignition apparatus of the internal combustion engine can be improved.

DESCRIPTION OF THE INVENTION

Hereinafter, one embodiment according to the present invention will be explained referring to drawings.

First of all, referring to from FIG. 1 to FIG. 5, one embodiment of an ignition apparatus and an ignition control system of an internal combustion engine and IGBT of an internal combustion engine will be explained.

Figure 1:
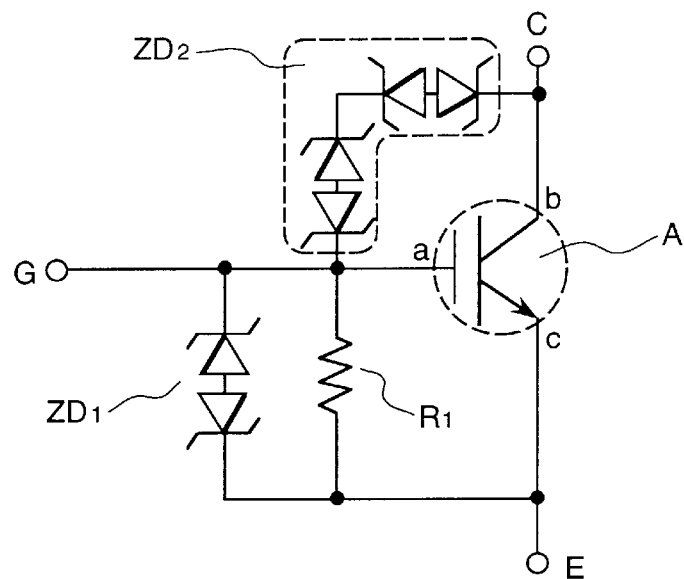
FIG. 1 is a basic equivalent circuitry of one embodiment of IGBT of an ignition apparatus of an internal combustion engine according to the present invention.

FIG. 1 shows one example of an equivalent circuitry of IGBT of an ignition apparatus of an internal combustion engine. As connection terminals to an outside, it has three terminals comprised of a gate electrode G, a collector electrode C, and an emitter electrode E, and between the gate electrode G and the emitter electrode E, a Zener diode ZD 1 for use a protection and a resistor R1 are connected.

Between the collector electrode C and the gate electrode G, to clamp a high voltage (a flyback voltage) which is generated at a shutdown time of a primary current of an ignition coil, a binary direction type Zener diode using a poly-silicon is provided.

Figure 2:
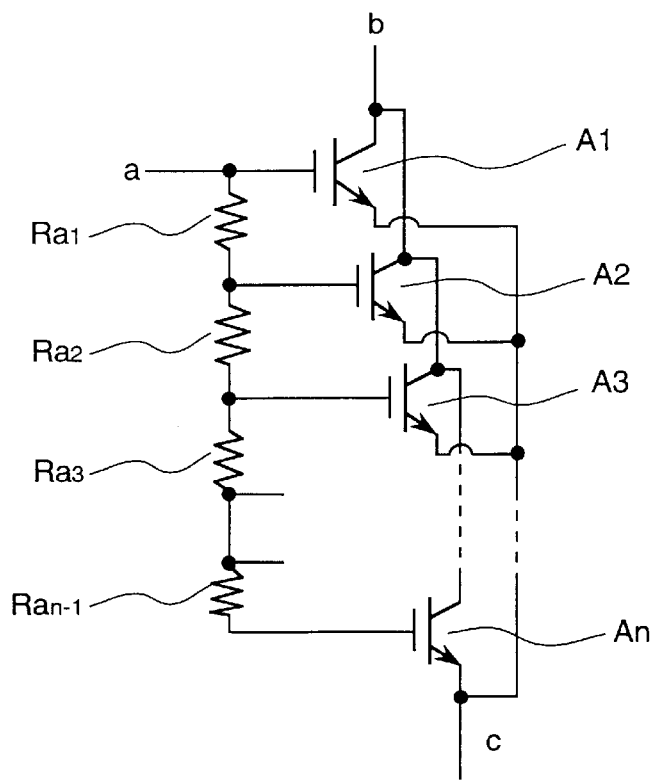
FIG. 2 is a detail of the basic equivalent circuitry of one embodiment of IGBT of an ignition apparatus of an internal combustion engine according to the present invention.

FIG. 2 shows a detail of IGBT main body portion A. IGBT main body portion A of the equivalent circuitry shown in FIG. 1, as shown in FIG. 2, is constituted by connecting in parallel minute IGBT A1–An. Between the respective gate electrode of these minute IGBT A1–An, there exist resistors Ra1-Ran-1 due to the connection of wiring.

Herein, to the gate electrode portion of IGBT when a serge or noises having a speedy pulse (a high frequency pulse) is superposed, with an ordinary operation signal, the minute IGBT A1–An being driven by synchronizing the signal can not follow to the speedy pulse (the high frequency pulse) according to the wiring resistance of Ra1-Ran-1.

However, since the minute IGBT are driven successively with A1, A2, A3, . . . , An, in a whole IGBT since the minute IGBT are driven locally, there occurs a case in which a latch-up and the current destroy etc. generate according to the thermal heat of the minute IGBT.

In the present invention, it aims that the wiring resistance Ra1-Ran-1 formed between the respective minute IGBT gate electrodes which becomes a scattering case of the drive start speed of the above stated minute IGBT can be reduced.

Figure 3:
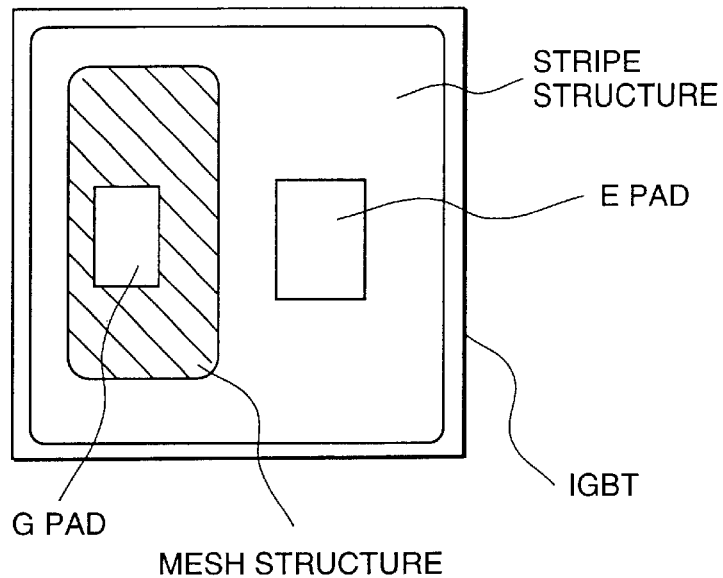
FIG. 3 is an appearance view of one embodiment IGBT chip of an ignition apparatus of an internal combustion engine according to the present invention.

One embodiment of the reduction of the resistance between the minute IGBT will be explained referring to form FIG. 3 to FIG. 5. FIG. 3 shows an appearance view of IGBT chip which corresponds to the equivalent circuitry shown in FIG. 1 and is seen from a surface of the chip.

To a chip surface, an outside connection use gate (G) pad made by Al electrode and an emitter (E) pad are arranged, in an ordinary they are connected to the outside using Al wire supersonic welding (a bonding). Further, not shown in figure, a rear face of the chip forms a collector electrode and a metal layer carried out taking under a consideration a soldering.

In ordinary, a whole chip is constituted by the wiring of the pattern, which is called as a mesh construction or a stripe structure. In the mostly conventional IGBT employ the stripe structure to improve the latch-up. However, the mesh structure has merits such as a small performance by reducing specific resistance.

According to the present invention, by making practical application of the above stated respective merits, IGBT having the improved noise resistant performance and the improved resistant serge performance is devised. In this embodiment, forming an area of the mesh structure less than 50%, in particularly a good result can be obtained.

Figure 4:
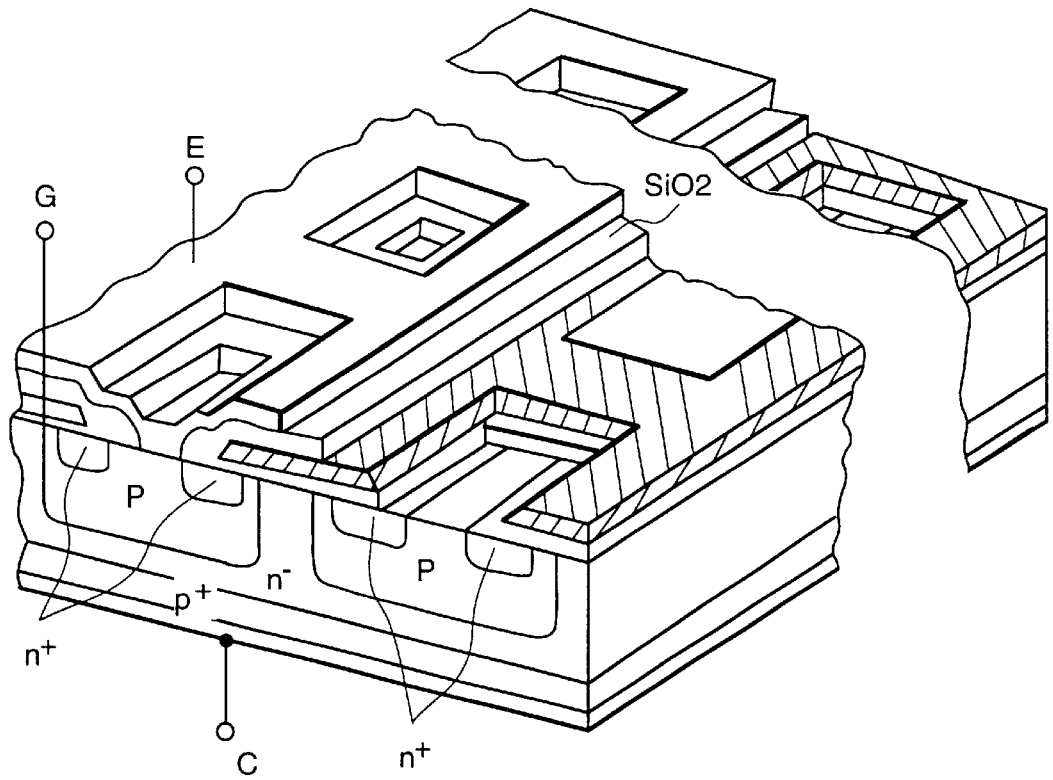
FIG. 4 is a mesh structure view of one embodiment IGBT chip of an ignition apparatus of an internal combustion engine according to the present invention.
Figure 5:
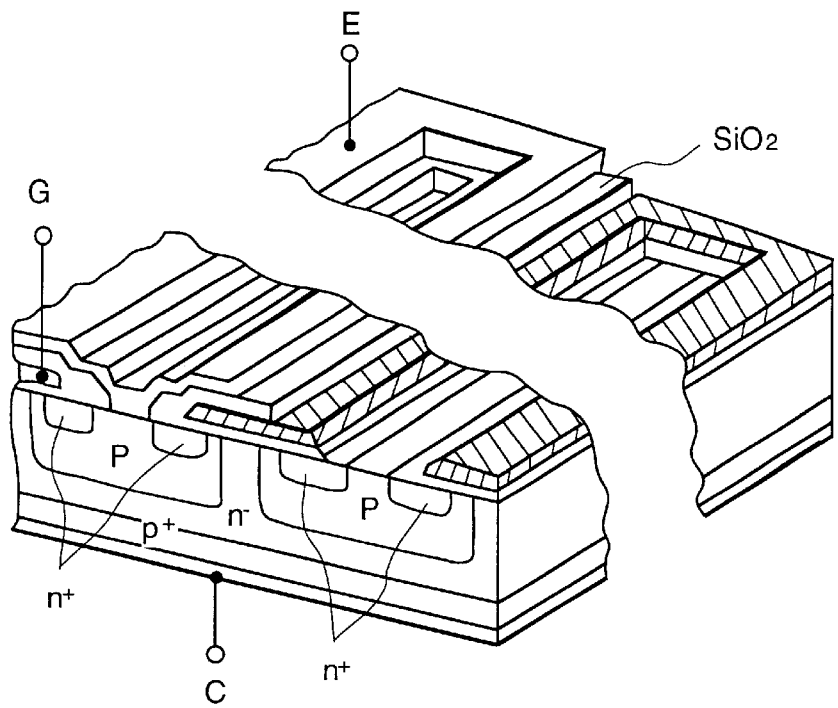
FIG. 5 is a stripe structure view of one embodiment IGBT chip of an ignition apparatus of an internal combustion engine according to the present invention.

FIG. 4 shows a structural view showing the wiring of the mesh structure and FIG. 5 shows the stripe structure. In FIG. 4, on a basic structure of pnpn type IGBT a gate wiring which is insulated according to $SiO_2$ insulation layer is arranged latticed and an emitter wiring which is connected to p layer is wired similarly to a gate wiring.

The stripe construction shown in FIG. 5, against to the mesh construction shown in FIG. 4, is not wired with lattice shape but is wired with the stripe shape, and at a corner portion a broadening of a substantial width of $n^+$emitter area is removed and also an electrode contact area of $p^+$emitter is made large, npn type transistor operation according to the Hall current can be restrained to be lower.

From the construction, the area of wiring of the stripe construction is smaller than that of the mesh construction. Namely, $p^+$emitter area is not broaden at the corner portion (the corner portion is small). Further, the contact area of $p^+$emitter electrode is broaden and the operation of npn transistor can be lower (can hardly to present "ON").

According to the present invention, to reduce the wiring resistance Ra1-Pan-1 shown in FIG. 2, the mesh construction is provided at a part of the gate wiring. As the whole chip, by the employment of the stripe construction, an afford degree against the latch-up of IGBT can be attained.

Figure 6:
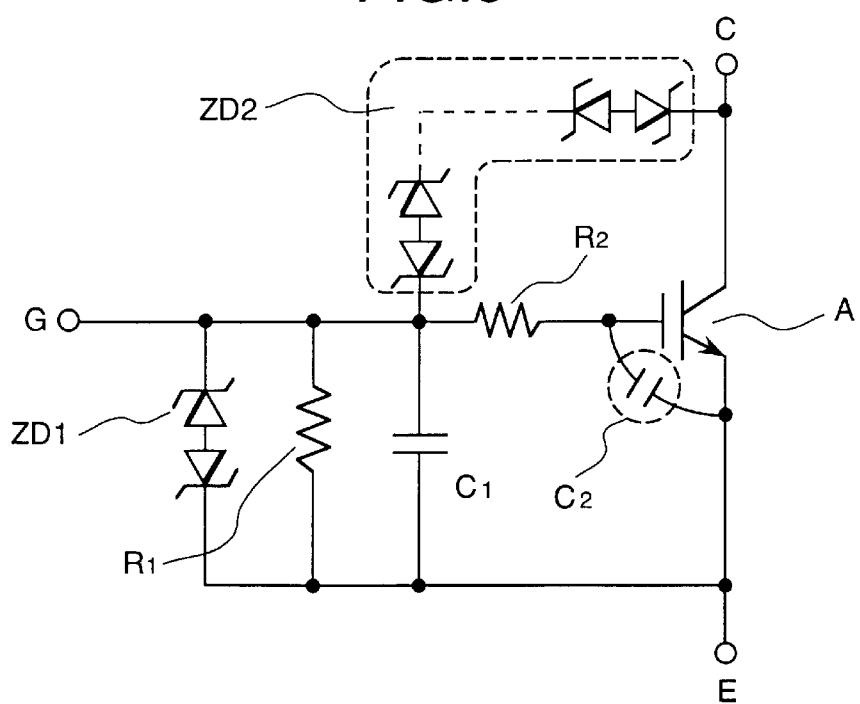
FIG. 6 is an equivalent circuitry of an ignition apparatus of an internal combustion engine according to the present invention.

Next, in FIG. 6, against the basic equivalent circuit of IGBT shown in FIG. 1, a condenser C1 and a resistor R2 are added. The condenser C2 is a condenser which exists from the prior by the parasitism between the gate electrode G and the emitter electrode E. The condenser C1 constitutes a high pass filter against to an input and the resistor R2 constitutes a low pass filter circuit of CR (condenser-resistor) with the condenser C2.

Figure 7:
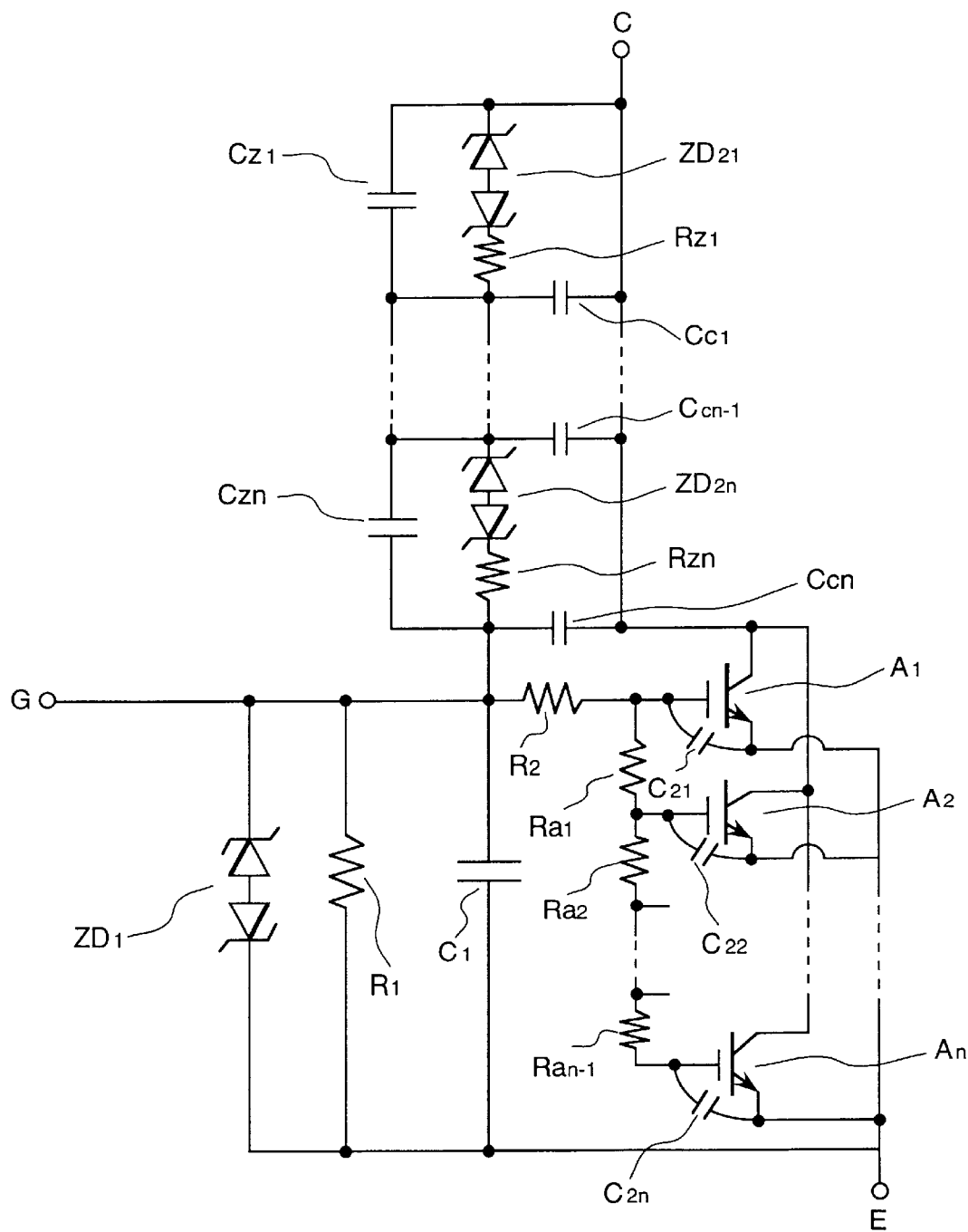
FIG. 7 is a detail view of the equivalent circuitry of an ignition apparatus of an internal combustion engine according to the present invention.

FIG. 7 shows a detail of the equivalent circuitry of IGBT using the present invention. ZD2 shown in FIG. 1 and FIG. 6 has a construction shown in FIG. 7 and in which the resistance parts Rz1–Rzn are arranged in series to the binary direction Zener diodes ZD21–ZD2n and Cz1–Czn are arranged in parallel, then Cc1–Ccn is existed as the floating condensers. In IGBT used as the ignitor, in particularly the high voltage having the rapid speed (the high frequency) generated to the collector portion.

Further, since the collector portion is connected to the ignition coil which generates the high voltage, the serges and the noises are superposed easily from the ignition coil, the rapid speed serge which is superposed to the collector portion is superposed to the gate portion of IGBT through the condenser combination portions of Cz1–Czn and Cc1–Ccn shown in FIG. 7.

Since the serge being superposed by this route is impossible to countermeasure according to the outside circuit of IGBT chip, as shown in the present invention, by forming the operation balance of the minute IGBT it is necessary to perform the resistant weight-up as the whole element.

Figure 8:
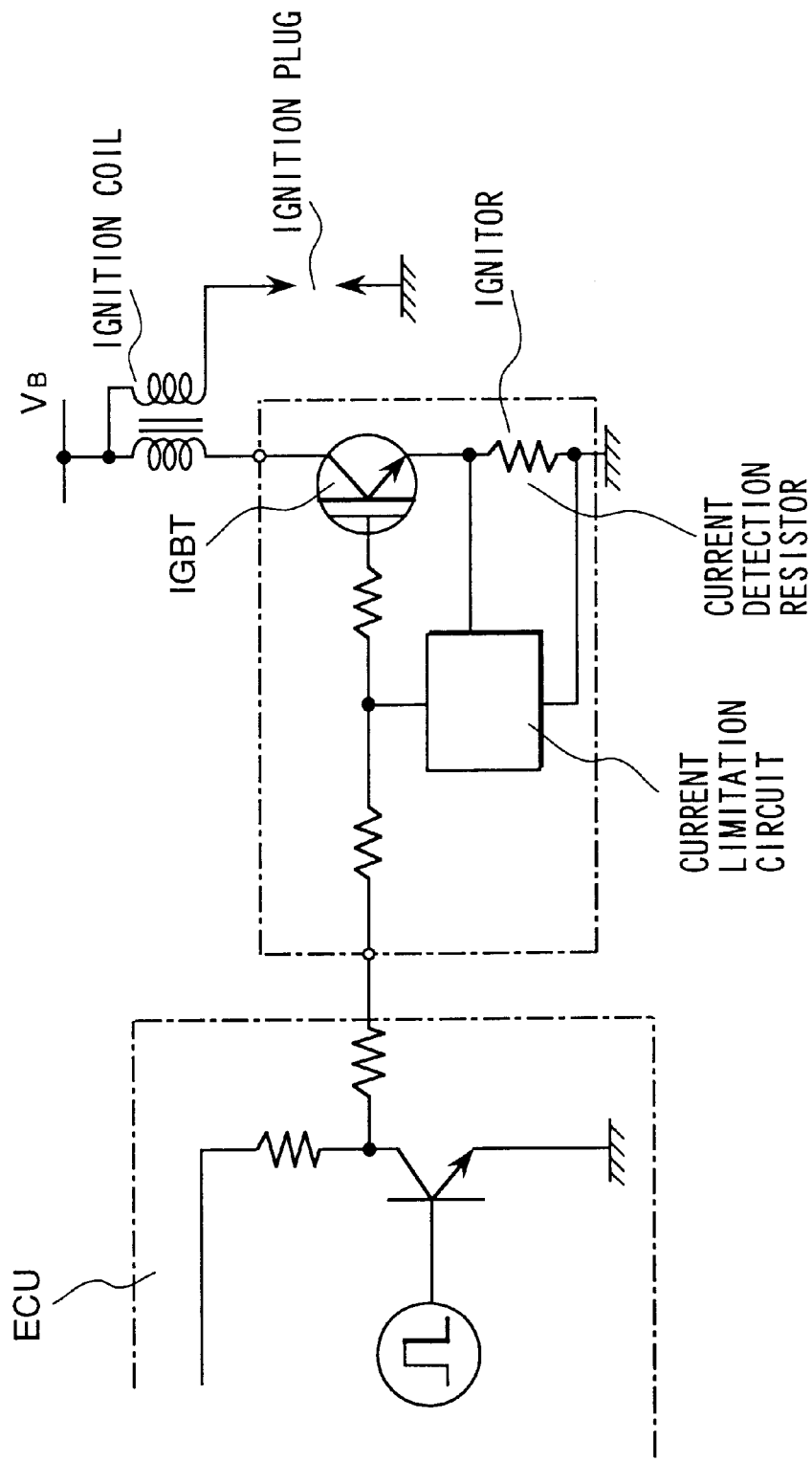
FIG. 8 is a circuitry showing a whole ignition apparatus of an internal combustion engine according to the present invention.

FIG. 8 is a circuitry of the ignition apparatus using IGBT according to the present invention.

Further, another embodiment will be explained simplify hereinafter.

An ignition control system comprising an ignition apparatus having a circuit for controlling a primary current of an ignition coil of an internal combustion engine in response to a signal from an outside and a part of said circuit is formed by IGBT (an insulation gate type bipolar transistor) and further a gate electrode of said IGBT has a cell having two different shapes, and a control of a fuel amount for supplying to the internal combustion engine and a control apparatus for controlling an ignition of the internal combustion engine.

According to the present invention, the resistant properties against the serges and the noises etc. which is difficult to do an expectation under the severe use environment ignition coil integrated condition can be improved remarkably and the ignitor use IGBT having a high reliability can be supplied.

Further, since it is unnecessary to devise the protection function of IGBT against the outside loads such as the serge and the noises etc. by the peripheral circuit, the small size and the low cost ignition apparatus (the ignitor) can be obtained.

What is claimed is:

1. An ignition apparatus of an internal combustion engine comprising a circuit for controlling a primary current of an ignition coil of the internal combustion engine according to a signal from outside, said circuit having an insulated gate type bipolar transistor (IGBT), wherein:

an interior gate electrode of said IGBT is constituted by a cell having two different shapes; and of said two different shapes, one is a stripe shape cell and another is a mesh shape cell.

2. The ignition apparatus according to claim 1, wherein:
said stripe shape cell is primary and said mesh shape cell is subordinate.

3. The ignition apparatus comprising a circuit for controlling a primary current of an ignition coil of the internal combustion engine according to a signal from outside, said circuit has an insulated gate type bipolar transistor (IGBT), wherein:

an interior gate electrode of said IGBT is constituted by a cell having two different shapes; and said IGBT has a voltage clamp use Zener diode which is provided between a collector electrode and a gate electrode in an internal portion thereof.

4. The ignition apparatus according to claim 3, further comprising:

a condenser provided between said gate electrode and an emitter electrode; and a resistor connected to said gate voltage;

wherein said resistor is provided to a side of said gate electrode from said condenser, and is provided to a side of said gate electrode from said Zener diode condenser.

5. An ignition control system of an internal combustion engine comprising:

an ignition apparatus having a circuit for controlling a primary current of an ignition coil of an internal combustion engine in response to a signal from outside and a part of said circuit is formed by an insulated gate type bipolar transistor (IGBT) and further a gate electrode of said IGBT has a cell having two different shapes; and a control of a fuel amount for supplying to the internal combustion engine and a control apparatus for controlling an ignition of the internal combustion engine.

6. an insulated gate type bipolar transistor (IGBT) of an internal combustion engine in which an internal portion gate electrode is constituted by a cell having two different shapes.

7. An insulated gate type bipolar transistor (IGBT) of an internal combustion engine comprising:

a condenser which is provided between a gate electrode and an emitter electrode of said IGBT; and a resistor connected to a gate voltage;

wherein said resistor is provided to a side of said gate electrode from said condenser and is provided to a side of said gate electrode from a Zener diode condenser.

* * * * *